(12) United States Patent
Sasaki (10) Patent No.: US 9,657,410 B2
(45) Date of Patent: May 23, 2017

(54) METHOD FOR PRODUCING $GA_2O_3$ BASED CRYSTAL FILM

(71) Applicant: TAMURA CORPORATION, Tokyo (JP)

(72) Inventor: Kohei Sasaki, Tokyo (JP)

(73) Assignee: TAMURA CORPORATION, Tokyo (JP)

( * ) Notice: Subject to any disclaimer, the term of this patent is extended or adjusted under 35 U.S.C. 154(b) by 357 days.

(21) Appl. No.: 14/357,180

(22) PCT Filed: Nov. 27, 2012

(86) PCT No.: PCT/JP2012/080623
§ 371 (c)(1),
(2) Date: May 8, 2014

(87) PCT Pub. No.: WO2013/080972
PCT Pub. Date: Jun. 6, 2013

(65) Prior Publication Data
US 2014/0331919 A1   Nov. 13, 2014

(30) Foreign Application Priority Data
Nov. 29, 2011   (JP) .................................. 2011-260493

(51) Int. Cl.
*C30B 29/16* (2006.01)
*C30B 23/06* (2006.01)
(Continued)

(52) U.S. Cl.
CPC .......... *C30B 23/066* (2013.01); *C30B 23/005* (2013.01); *C30B 29/16* (2013.01);
(Continued)

(58) Field of Classification Search
CPC ................................ C30B 23/02; C30B 29/16
See application file for complete search history.

(56) References Cited

U.S. PATENT DOCUMENTS 6,897,560 B2 *   5/2005   Ota ........................ C23C 14/08
                                                      252/518.1
2003/0107098 A1   6/2003   Ota et al.
(Continued)

FOREIGN PATENT DOCUMENTS

EP   1 306 858 A1    5/2003
EP   1 598 450 A2   11/2005
(Continued)

OTHER PUBLICATIONS

Partial European Search Report dated Jan. 28, 2015 (English-language version).
(Continued)

*Primary Examiner* — Robert M Kunemund
(74) *Attorney, Agent, or Firm* — McGinn IP Law Group, PLLC.

(57) ABSTRACT

A $Ga_2O_3$ crystal film is epitaxially grown on a $Ga_2O_3$ crystal substrate using an MBE method, while controlling the n-type conductivity with high accuracy. Provided is a method for producing a $Ga_2O_3$ crystal film, wherein a conductive $Ga_2O_3$ crystal film is formed by epitaxial growth using an MBE method. This method for producing a $Ga_2O_3$ crystal film comprises a step wherein a $Ga_2O_3$ single crystal film containing Sn is grown by producing a Ga vapor and an Sn vapor and supplying the Ga vapor and the Sn vapor to the surface of a $Ga_2O_3$ crystal substrate as molecular beams. The Sn vapor is produced by heating Sn oxide that is filled in a cell of an MBE apparatus.

20 Claims, 7 Drawing Sheets

(51) Int. Cl.
 *H01L 21/02* (2006.01)
 *C30B 23/00* (2006.01)
(52) U.S. Cl.
 CPC .. *H01L 21/02414* (2013.01); *H01L 21/02565* (2013.01); *H01L 21/02576* (2013.01); *H01L 21/02631* (2013.01)

(56) References Cited

U.S. PATENT DOCUMENTS

2008/0038906 A1   2/2008  Ichinose et al.
2014/0217469 A1   8/2014  Sasaki et al.

FOREIGN PATENT DOCUMENTS

| EP | 2 765 612 A1 | 8/2014 |
| JP | 2002-093243 A | 3/2002 |
| JP | 4083396 B2 | 4/2008 |
| JP | 2008-303119 A | 12/2008 |
| WO | WO 2013/035842 A1 | 3/2013 |

OTHER PUBLICATIONS

Japanese Office Action, dated Aug. 22, 2016, with a partial English translation.
International Search Report dated Mar. 5, 2013 in PCT/JP2012/080623 (English version).
Min-Ying Tsaia et al, "β-$Ga_2O_3$ growth by plasma-assisted molecular beam epitaxy", J. Vac. Sci.Technol. A, Mar. 2010, vol. 28, No. 2, pp. 354-359.

\* cited by examiner

METHOD FOR PRODUCING GA₂O₃ BASED CRYSTAL FILM

TECHNICAL FIELD

The invention relates to a method for producing a $Ga_2O_3$ based crystal film.

BACKGROUND ART

A method of forming a conductive $Ga_2O_3$ crystal film on a crystal substrate such as sapphire substrate by heteroepitaxial growth is known as a conventional method for producing a $Ga_2O_3$ based crystal film (see e.g. PTL 1). PTL 1 discloses that a $Ga_2O_3$ crystal film is formed using an MBE method and Sn is used as a conductive impurity for imparting conductivity to the $Ga_2O_3$ crystal film.

CITATION LIST

Patent Literature

PTL 1
    Japanese patent No. 4,083,396

SUMMARY OF INVENTION

Technical Problem

It is an object of the invention to epitaxially grow a $Ga_2O_3$ based crystal film on a $Ga_2O_3$ based crystal substrate using an MBE method while controlling the n-type conductivity with high accuracy.

Solution to Problem

According to one embodiment of the invention, a method for producing a $Ga_2O_3$ based crystal film as defined in [1] to [3] below is provided so as to achieve the above object.

[1] A method for producing a $Ga_2O_3$ based crystal film using a MBE method to form a conductive $Ga_2O_3$ based crystal film by epitaxial growth, comprising a step of generating Ga vapor and Sn vapor and supplying the Ga vapor and the Sn vapor as a molecular beam to a surface of a $Ga_2O_3$ based crystal substrate so as to grow a $Ga_2O_3$ based single crystal film comprising Sn,
    wherein the Sn vapor is generated by heating a Sn oxide that is filled in a cell of an MBE apparatus.
[2] The method for producing a $Ga_2O_3$ based crystal film according to [1], wherein the Sn oxide comprises $SnO_2$, and
    wherein the Sn vapor is generated at a temperature of the cell of 650° C. to 925° C.
[3] The method for producing a $Ga_2O_3$ based crystal film according to [1] or [2], wherein the $Ga_2O_3$ single crystal is epitaxially grown at a growth rate of 0.01 to 100 μm/h.
[4] The method for producing a $Ga_2O_3$ based crystal film according to any one of [1] to [3], wherein a carrier concentration of the $Ga_2O_3$ based crystal film is $1\times10^{14}$ to $1\times10^{20}/cm^3$.
[5] The method for producing a $Ga_2O_3$ based crystal film according to [1], wherein the Sn oxide comprises $SnO_2$, and
    wherein the Sn vapor is generated at a temperature of the cell of 450° C. to 1080° C.
[6] The method for producing a $Ga_2O_3$ based crystal film according to [5], wherein the $Ga_2O_3$ single crystal is epitaxially grown at a growth rate of 0.01 to 100 μm/h.
[7] The method for producing a $Ga_2O_3$ based crystal film according to [5], wherein the $Ga_2O_3$ single crystal is epitaxially grown at a growth temperature of 530° C. to 600° C.

Advantageous Effects of Invention

According to one embodiment of the invention, a $Ga_2O_3$ based crystal film can be epitaxially grown on a $Ga_2O_3$ based crystal substrate using an MBE method while controlling the n-type conductivity with high accuracy.

DESCRIPTION OF EMBODIMENTS

Embodiment

As a result of study and investigation, the present inventors found that conductivity is greatly affected by the type of raw material of conductive impurity for imparting conductivity to a $Ga_2O_3$ based crystal film when a conductive $Ga_2O_3$ based crystal film is epitaxially grown on a substrate formed of a $Ga_2O_3$ based crystal, and it is necessary to use a Sn oxide.

A $Ga_2O_3$ based crystal film formed on a $Ga_2O_3$ based crystal substrate by epitaxial growth can have higher quality than that formed on a substrate having a greatly different crystal structure by heteroepitaxial growth.

In the present embodiment, a highly-conductive $Ga_2O_3$ based crystal film is epitaxially grown and formed on a $Ga_2O_3$ based crystal substrate by the molecular beam epitaxy (MBE) method using an appropriately selected type of raw material of conductive impurity and heating temperature of the raw material. An example embodiment thereof will be described below.

($Ga_2O_3$ Based Crystal Film)

Figure 1:
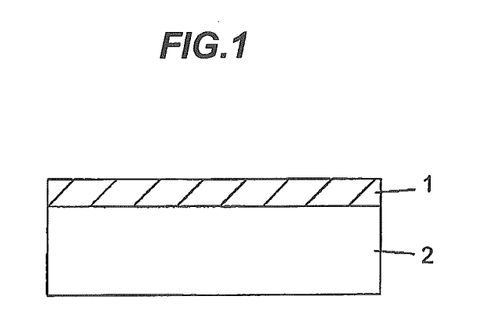
FIG. 1 is a vertical cross sectional view showing a $Ga_2O_3$ based crystal substrate and a $Ga_2O_3$ based crystal film in an embodiment.

FIG. 1 is a vertical cross sectional view showing a $Ga_2O_3$ based crystal substrate and a $Ga_2O_3$ based crystal film in the embodiment.

A $Ga_2O_3$ based crystal film 1 is formed by epitaxially growing a $Ga_2O_3$ based single crystal on a $Ga_2O_3$ based crystal substrate 2 using the MBE method. The MBE method is a crystal growth method in which a raw material used alone or as a compound is heated in an evaporation source called cell and vapor generated by heat is supplied as a molecular beam onto the surface of the substrate to epitaxially grow a crystal.

The $Ga_2O_3$ based crystal film 1 is formed of an n-type $\beta$-$Ga_2O_3$ single crystal containing Sn as a conductive impurity. Here, the $\beta$-$Ga_2O_3$ based single crystal means a $\beta$-$Ga_2O_3$ single crystal as well as a $\beta$-$Ga_2O_3$ single crystal in which a Ga site is substituted by Al, etc. (e.g., a $\beta$-$(Al_xGa_{1-x})_2O_3$ single crystal (0<x<1)). The $Ga_2O_3$ based crystal film 1 has a thickness of, e.g., about 10 to 1000 nm.

The carrier concentration in the $Ga_2O_3$ based crystal film 1 is $1\times10^{14}$ to $1\times10^{20}/cm^3$. This carrier concentration can be controlled by temperature of a second cell 13b of a below-described MBE apparatus 3 during film formation. The second cell 13b is a cell filled with $SnO_2$ as a raw material of Sn which is an impurity for imparting conductivity to the $Ga_2O_3$ based crystal film 1.

The $Ga_2O_3$ based crystal substrate 2 is formed of a $\beta$-$Ga_2O_3$ s based ingle crystal of which resistance is increased by adding an impurity such as Mg.

The $Ga_2O_3$ based crystal substrate 2 is made by, e.g., the following procedure. Firstly, a semi-insulating $\beta$-$Ga_2O_3$ single crystal ingot doped with an impurity is made by the EFG method. As the impurity, it is possible to use, e.g., H, Li, Na, K, Rb, Cs, Fr, Be, Ca, Sr, Ba, Ra, Mn, Fe, Co, Ni, Pd, Cu, Ag, Au, Zn, Cd, Hg, Ti or Pb when substituting Ga site. Meanwhile, it is possible to use N or P when substituting oxygen site. For example, for doping Mg, MgO powder is mixed to raw material powder. Not less than 0.05 mol % of MgO is added to impart good insulation properties to the $Ga_2O_3$ based crystal substrate 2. Alternatively, the semi-insulating $\beta$-$Ga_2O_3$ single crystal ingot may be made by the FZ method. The obtained ingot is sliced to a thickness of, e.g., about 1 mm so that the principal surface has a desired plane orientation, thereby forming a substrate. Then, a grinding and polishing process is performed to a thickness of about 300 to 600 μm.

Method for Producing $Ga_2O_3$ Based Crystal Film

Figure 2:
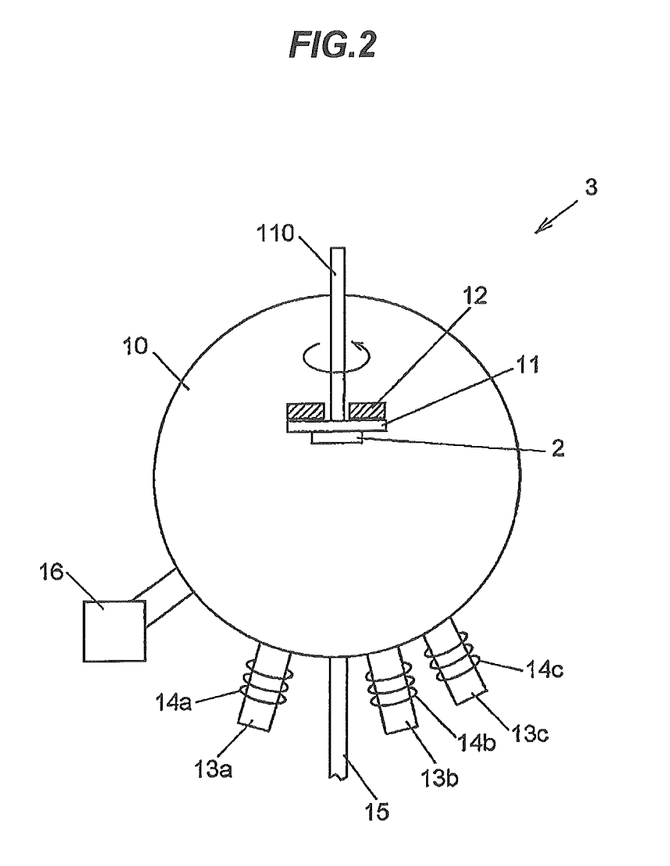
FIG. 2 shows a configuration example of an MBE apparatus used for forming the $Ga_2O_3$ based crystal film.

FIG. 2 shows an example configuration of an MBE apparatus used for forming the $Ga_2O_3$ based crystal film. A MBE apparatus 3 is provided with a vacuum chamber 10, a substrate holder 11 supported in the vacuum chamber 10 to hold the $Ga_2O_3$ based crystal substrate 2, heating devices 12 held on the substrate holder 11 to heat the $Ga_2O_3$ based crystal substrate 2, plural cells 13 (13a, 13b, 13c) filled with raw materials of atoms constituting the $Ga_2O_3$ based crystal film 1, heaters 14 (14a, 14b, 14c) for hearing the cells 13, a gas supply pipe 15 for supplying oxygen-based gas into the vacuum chamber 10, and a vacuum pump 16 for exhausting the air in the vacuum chamber 10. It is configured that the substrate holder 11 can be rotated by a non-illustrated motor via a shaft 110.

The first cell 13a is filled with a Ga raw material of the $Ga_2O_3$ based crystal film 1, such as Ga powder. The Ga powder desirably has a purity of not less than 6N. The second cell 13b is filled with the Sn oxide ($SnO_2$ or SnO) powder which is a Sn raw material to be doped as a donor to the $Ga_2O_3$ based crystal film 1. The Sn oxide may not be in the form of powder. The third cell 13c is filled with, e.g., an Al raw material which is used when the $Ga_2O_3$ based crystal film 1 is formed of a $\beta$-$(Al_xGa_{1-x})_2O_3$ single crystal. A shutter is provided at an opening of each of the first cell 13a, the second cell 13b and the third cell 13c.

Firstly, the preliminarily-formed $Ga_2O_3$ based crystal substrate 2 is attached to the substrate holder 11 of the MBE apparatus 3. Next, the vacuum pump 16 is activated to reduce atmospheric pressure in the vacuum chamber 10 to about $1\times10^{-8}$ Pa. Then, the $Ga_2O_3$ based crystal substrate 2 is heated by the heating devices 12. Here, radiation heat of heat source such as graphite heater of the heating device 12 is thermally transferred to the $Ga_2O_3$ based crystal substrate 2 via the substrate holder 11 and the $Ga_2O_3$ based crystal substrate 2 is thereby heated.

After the $Ga_2O_3$ based crystal substrate 2 is heated to a predetermined temperature, oxygen-based gas such as oxygen radical is supplied into the vacuum chamber 10 through the gas supply pipe 15. Partial pressure of the oxygen-based gas is, e.g., $5\times10^{-4}$ Pa.

After a period of time required for stabilization of gas pressure in the vacuum chamber 10 (e.g., after 5 minutes), the first cell 13a, the second cell 13b and, if necessary, the third cell 13c are heated by the first heater 14a, the second heater 14b and the third heater 14c, respectively, while rotating the substrate holder 11 so that Ga, Sn and Al are evaporated and are radiated as molecular beam onto the surface of the $Ga_2O_3$ based crystal substrate 2.

For example, the first cell 13a is heated to 900° C. and beam-equivalent pressure (BEP) of Ga vapor is $2\times10^{-4}$ Pa. The second cell 13b filled with $SnO_2$ is heated to 650 to 925° C., and beam-equivalent pressure of Sn vapor varies depending on the temperature of the second cell 13b.

As such, the $\beta$-$Ga_2O_3$ based single crystal is epitaxially grown on the $Ga_2O_3$ based crystal substrate 2 while being doped with Sn and the $Ga_2O_3$ based crystal film 1 is thereby formed.

Here, a growth temperature and a growth rate of the $\beta$-$Ga_2O_3$ based single crystal are, e.g., respectively 700° C. and 0.01 to 100 μm/h.

The carrier concentration in the $Ga_2O_3$ based crystal film 1 is $1\times10^{14}$ to $1\times10^{20}/cm^3$ and is controlled by the temperature of the second cell 13b.

Effects of the Embodiment

According to the present embodiment, it is possible to form a highly-conductive $Ga_2O_3$ based crystal film on a $Ga_2O_3$ based crystal substrate by epitaxial growth using the MBE method. It is possible to use the formed $Ga_2O_3$ based crystal film as components of semiconductor elements such as $Ga_2O_3$ based light-emitting devices or transistors.

The invention is not intended to be limited to the above-mentioned embodiment, and the various kinds of modifications can be implemented without departing from the gist of the invention.

EXAMPLES

Example 1

A relation between the temperature of the second cell 13b filled with $SnO_2$ powder and the carrier concentration in the $Ga_2O_3$ crystal film 1 was obtained by experiment.

In the present Example, a substrate formed of a high-resistance $\beta$-$Ga_2O_3$ single crystal doped with 0.25 mol % of Mg was used as the $Ga_2O_3$ based crystal substrate 2. Meanwhile, a film of a $\beta$-$Ga_2O_3$ single crystal was formed as the $Ga_2O_3$ based crystal film 1. The principal surface of the $Ga_2O_3$ based crystal substrate was a (010) plane. The plane orientation of the substrate is not specifically limited but the principal surface of the $Ga_2O_3$ based crystal substrate is preferably a plane rotated by not less than 50° and not more than 90° with respect to a (100) plane. In other words, on the Ga$_2$O$_3$ based substrate, an angle θ (0<θ≤90°) formed between the principal surface and the (100) plane is preferably not less than 50°. Examples of the plane rotated by not less than 50° and not more than 90° with respect to the (100) plane include a (010) plane, a (001) plane, a (−201) plane, a (101) plane and a (310) plane.

In addition, during the film formation of the Ga$_2$O$_3$ based crystal film 1, partial pressure of the oxygen-based gas was 5×10$^{-4}$ Pa, the temperature of the first cell 13a was 900° C., beam-equivalent pressure of Ga vapor was 2×10$^{-4}$ Pa, the growth temperature of the β-Ga$_2$O$_3$ single crystal was 700° C. and the growth rate of the β-Ga$_2$O$_3$ single crystal was 0.7 μm/h.

Various samples were made at different temperatures of the second cell 13b filled with SnO$_2$ in a range of 750 to 850° C. Then, the carrier concentration of each was measured by Hall measurement to obtain a relation between the temperature of the second cell 13b and the collier concentration in the Ga$_2$O$_3$ based crystal film 1.

Figure 3:
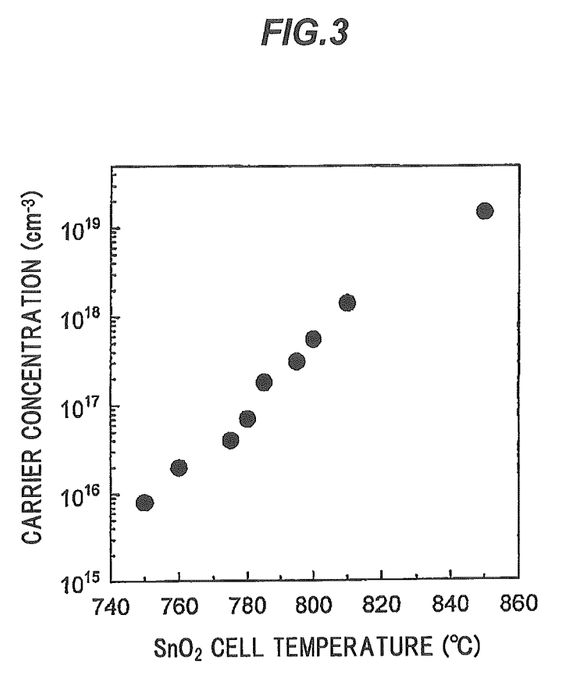
FIG. 3 is a graph showing a relation between temperature of a second cell filled with $SnO_2$ and a carrier concentration in the $Ga_2O_3$ based crystal film in Example 1.

FIG. 3 is a graph showing a relation between the temperature of the second cell 13b and the carrier concentration in the Ga$_2$O$_3$ based crystal film 1, which was obtained by measurement under the conditions mentioned above. In FIG. 3, the horizontal axis indicates the temperature of the second cell 13b filled with SnO$_2$ powder and the vertical axis indicates the carrier concentration in the Ga$_2$O$_3$ based crystal film 1. FIG. 3 is a semi-log graph in which the vertical axis is plotted on a logarithmic scale.

As shown in FIG. 3, the measured values on the semi-log graph form a substantially straight line which shows that the carrier concentration in the Ga$_2$O$_3$ based crystal film 1 increases with an increase in the temperature of the second cell 13b.

In addition, when the growth rate of the β-Ga$_2$O$_3$ single crystal is multiplied by n (n is a positive real number), the concentration of SnO$_2$ added to the Ga$_2$O$_3$ based crystal film 1 is 1/n and the carrier concentration is also 1/n. Therefore, as shown in FIG. 4, the relation between the temperature of the second cell 13b and the carrier concentration in the Ga$_2$O$_3$ based crystal film 1 at the growth rate of 0.01 to 100 μm/h can be obtained based on the relation at the growth rate of 0.7 μm/h.

Here, 0.01 to 100 μm/h is a growth rate generally used for the β-Ga$_2$O$_3$ single crystal. When the growth rate is 0.01 μm/h, for example, the temperature of the first cell 13a filled with the Ga raw material is 700° C. and partial pressure of the oxygen-based gas is 1×10$^{-5}$ Pa. Meanwhile, when the growth rate is 100 μm/h, for example, the temperature of the first cell 13a is 1200° C. and partial pressure of the oxygen-based gas is 1×10$^{-1}$ Pa.

Figure 4:
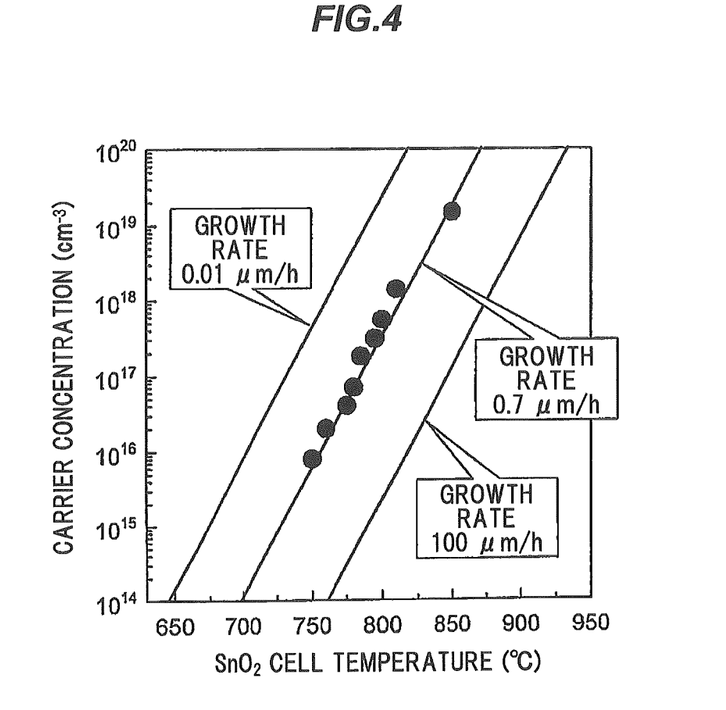
FIG. 4 is a graph showing a relation between temperature of the second cell filled with $SnO_2$ and a carrier concentration in the $Ga_2O_3$ based crystal film in Example 1.

The straight lines in FIG. 4 each indicating the relation between temperature of the second cell 13b and the carrier concentration in the Ga$_2$O$_3$ based crystal film 1 are obtained when the growth rates of the β-Ga$_2$O$_3$ single crystal are 0.01 μm/h, 0.7 μm/h and 100 μm/h.

It is seen from FIG. 4 that the temperature of the second cell 13b filled with SnO$_2$ powder should be 650 to 925° C. in order to obtain a generally-required carrier concentration of 1×10$^{14}$ to 1×10$^{20}$/cm$^3$ under the condition at the growth rate of 0.01 to 100 μm/h.

It was also possible to accurately control the n-type conductivity of the Ga$_2$O$_3$ based crystal film in case of using SnO as a Sn raw material even though the temperature range of the second cell 13b was different from that in the case of using SnO$_2$. In other words, it is possible to accurately control the n-type conductivity of the Ga$_2$O$_3$ based crystal film by using the Sn oxide as the Sn raw material.

On the other hand, if Sn instead of the Sn oxide was loaded as the Sn raw material in the second cell 13b to form the Ga$_2$O$_3$ based crystal film 1, it was not possible to obtain the carrier concentration of not less than 1×10$^{14}$/cm$^3$ regardless of the conditions such as the temperature of the second cell 13b or the growth rate of the β-Ga$_2$O$_3$ single crystal.

Figure 5:
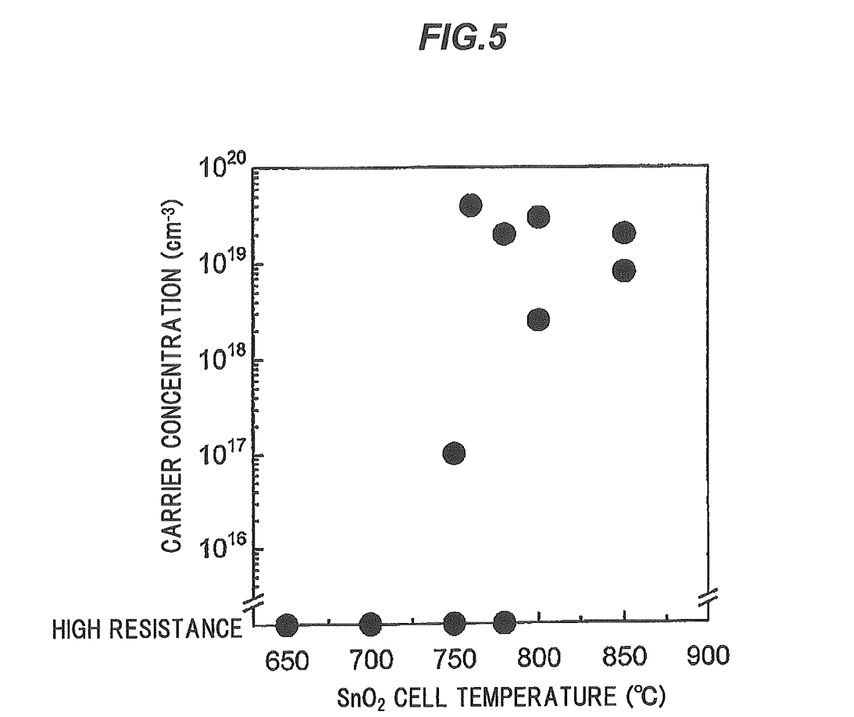
FIG. 5 is a graph showing a relation between temperature of the second cell filled with Si and a carrier concentration in the $Ga_2O_3$ based crystal film in Comparative Example.

Meanwhile, when Si was loaded as a conductive impurity in the second cell 13b instead of the Sn oxide to form the Ga$_2$O$_3$ based crystal film 1, it was not possible to control Si vapor pressure depending on the temperature of the second cell 13b even though the cause is not certain, and it was difficult to highly accurately control the Si amount in the Ga$_2$O$_3$ based crystal film 1. FIG. 5 is a graph showing a relation between the temperature of the second cell 13b filled with Si and the carrier concentration in the Ga$_2$O$_3$ based crystal film 1, which was obtained by experiment. The measurement conditions are the same as the case of using the Sn oxide. As shown in FIG. 5, the carrier concentration in the Ga$_2$O$_3$ based crystal film 1 varies even at the same temperature of the second cell 13b and conductivity is not obtained in some cases. Also, when Si oxide (SiO, SiO$_2$) was used instead of Si, it was not possible to control Si oxide vapor pressure depending on the temperature of the second cell 13b, and furthermore, the n-type conductivity of the Ga$_2$O$_3$ based crystal film 1 was not obtained regardless of the doped amount of Si oxide (even when doped with up to about several mol %).

Example 2

A relation between the temperature of the second cell 13b filled with SnO$_2$ powder and the donor concentration in the Ga$_2$O$_3$ based crystal film 1 was obtained by experiment.

In the present Example, a substrate formed of an n-type β-Ga$_2$O$_3$ single crystal doped with 0.05 mol % of Si was used as the Ga$_2$O$_3$ based crystal substrate 2. Meanwhile, a film of a β-Ga$_2$O$_3$ single crystal was formed as the Ga$_2$O$_3$ based crystal film 1.

The principal surface of the Ga$_2$O$_3$ based crystal substrate was a (010) plane. The plane orientation of the substrate is not specifically limited but the principal surface of the Ga$_2$O$_3$ based crystal substrate is preferably a plane rotated by not less than 50° and not more than 90° with respect to a (100) plane. In other words, on the Ga$_2$O$_3$ based substrate, an angle θ (0<θ≤90°) formed between the principal surface and the (100) plane is preferably not less than 50°. Examples of the plane rotated by not less than 50° and not more than 90° with respect the (100) plane include a (010) plane, a (001) plane, a (−201) plane, a (101) plane and a (310) plane.

During the film formation of the Ga$_2$O$_3$ based crystal film 1, partial pressure of the oxygen-based gas was 5×10$^{-4}$ Pa, the temperature of the first cell 13a was 900° C., beam-equivalent pressure of Ga vapor was 2×10$^{-4}$ Pa, the growth temperature of the β-Ga$_2$O$_3$ single crystal was 530° C., 570° C. and 600° C. and the growth rate of the β-Ga$_2$O$_3$ single crystal was 0.7 μm/h.

Various samples were made at different temperatures of the second cell 13b filled with SnO$_2$ in a range of 585 to 820° C. Then, the donor concentration of each was measured by C-V measurement to obtain a relation between the temperature of the second cell 13b and the donor concentration in the Ga$_2$O$_3$ based crystal film 1.

Figure 6:
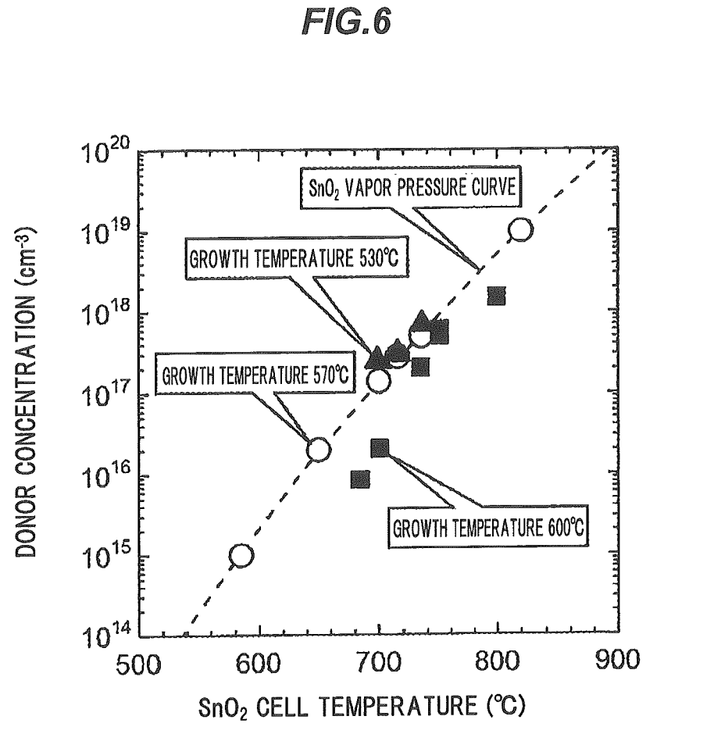
FIG. 6 is a graph showing a relation between temperature of the second cell filled with $SnO_2$ and a donor concentration in the $Ga_2O_3$ based crystal film in Example 2.

FIG. 6 is a graph showing a relation between the temperature of the second cell 13b and the miler concentration in the Ga$_2$O$_3$ based crystal film 1 (when the growth temperature is set to 530° C., 570° C. and 600°), which was obtained by measurement under the conditions mentioned above. In FIG. 6, the horizontal axis indicates the temperature of the second cell 13b filled with $SnO_2$ powder and the vertical axis indicates the donor concentration in the $Ga_2O_3$ based crystal film 1. FIG. 6 is a semi-log graph in which the vertical axis is plotted on a logarithmic scale.

As shown in FIG. 6, the donor concentration in the $Ga_2O_3$ based crystal film 1 increases with an increase in the temperature of the second cell 13b. Here, it was found that the amount of $SnO_2$ incorporated into an epi film changes with a change in the growth temperature. In detail, the incorporated amount of $SnO_2$ has a tendency to increase with a decrease in the growth temperature (growth temperature dependence). In this regard, however, the growth temperature dependence decreases at not more than 570° C. In addition, it was also found that the slope of the relation between the $SnO_2$ cell temperature and the donor concentration at the growth temperature of not more than 570° C. coincides with $SnO_2$ vapor pressure curve. It was confirmed that, when the growth temperature is lowered to 500° C., the epi surface becomes rough and a film having low crystal quality is grown. Therefore, the growth temperature (substrate temperature) is set between 530° C. and 600° C., preferably, between 530° C. and 570° C. to allow crystal quality to be maintained during growth.

In addition, when the growth rate of the β-$Ga_2O_3$ single crystal is multiplied by n (n is a positive real number), the concentration of $SnO_2$ added to the $Ga_2O_3$ based crystal film 1 is 1/n and the donor concentration is also 1/n. Therefore, as shown in FIG. 7, the relation between the temperature of the second cell 13b and the donor concentration in the $Ga_2O_3$ based crystal film 1 at the growth rate of 0.01 to 100 μm/h can be obtained based on the relation at the growth rate of 0.7 μm/h.

Here, 0.01 to 100 μm/h is a growth rate generally used for the β-$Ga_2O_3$ single crystal. When the growth rate is 0.01 μm/h, for example, the temperature of the first cell 13a filled with the Ga raw material is 700° C. and partial pressure of the oxygen-based gas is $1 \times 10^{-5}$ Pa. Meanwhile, when the growth rate is 100 μm/h, for example, the temperature of the first cell 13a is 1200° C. and partial pressure of the oxygen-based gas is $1 \times 10^{-1}$ Pa.

Figure 7:
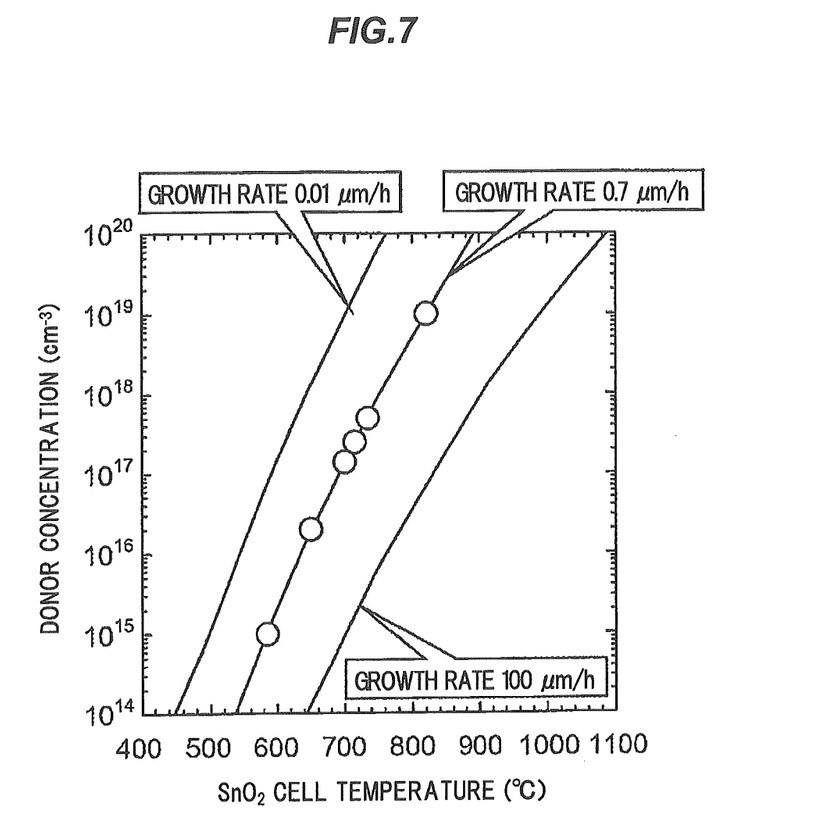
FIG. 7 is a graph showing a relation between temperature of the second cell filled with $SnO_2$ and a donor concentration in the $Ga_2O_3$ based crystal film in Example 2.

FIG. 7 is a graph showing a relation between temperature of the second cell 13b and the donor concentration in the $Ga_2O_3$ based crystal film 1 when the respective growth rates of the β-$Ga_2O_3$ single crystal are 0.01 μm/h, 0.7 μm/h and 100 μm/h (when the growth temperature is set to 570° C.).

It is seen from FIG. 7 that the temperature of the second cell 13b filled with $SnO_2$ powder should be 450 to 1080° C. in order to obtain a generally-required donor concentration of $1 \times 10^{14}$ to $1 \times 10^{20}/cm^3$ under the condition at the growth rate of 0.01 to 100 μm/h.

Although the experiment was conducted using the β-$Ga_2O_3$ single crystal as the $Ga_2O_3$ based crystal film 1 in the present Example, substantially the same result is obtained in case of using a β-$Ga_2O_3$ single crystal in which a Ga site is substituted by Al, etc.

Although the embodiment and examples of the invention have been described above, the invention according to claims is not to be limited to the above-mentioned embodiment and examples. Further, all combinations of the features described in the embodiment and examples are not necessary to solve the problem of the invention.

INDUSTRIAL APPLICABILITY

It is possible to epitaxially grow a $Ga_2O_3$ based crystal film on a $Ga_2O_3$ based crystal substrate using an MBE method while controlling the n-type conductivity with high accuracy.

REFERENCE SIGNS LIST

1 $Ga_2O_3$ based crystal film
2 $Ga_2O_3$ based crystal substrate
3 MBE apparatus
13b second cell

The invention claimed is:

1. A method for producing a $Ga_2O_3$ based crystal film using a molecular beam epitaxy (MBE) method to form a conductive $Ga_2O_3$ based crystal film by epitaxial growth, the method comprising:
   generating Ga vapor and Sn vapor and supplying the Ga vapor and the Sn vapor as a molecular beam to a surface of a $Ga_2O_3$ based crystal substrate, while an oxygen-based gas being supplied to a vacuum chamber, so as to grow a $Ga_2O_3$ based single crystal film comprising Sn,
   wherein the Sn vapor is generated by heating a Sn oxide that is filled in a cell of an MBE apparatus, and
   wherein the surface of the $Ga_2O_3$ based crystal substrate includes a plane rotated by not less than 50° and not more than 90° with respect to a (100) plane.

2. The method for producing a $Ga_2O_3$ based crystal film according to claim 1, wherein the Sn oxide comprises $SnO_2$, and
   wherein the Sn vapor is generated at a temperature of the cell of 650° C. to 925° C.

3. The method for producing a $Ga_2O_3$ based crystal film according to claim 1, wherein the $Ga_2O_3$ based single crystal film is epitaxially grown at a growth rate of 0.01 μm/h to 100 μm/h.

4. The method for producing a $Ga_2O_3$ based single crystal film according to claim 1, wherein a carrier concentration of the $Ga_2O_3$ based crystal film is $1 \times 10^{14}/cm^3$ to $1 \times 10^{20}/cm^3$.

5. The method for producing a $Ga_2O_3$ based crystal film according to claim 3, wherein a carrier concentration of the $Ga_2O_3$ based single crystal film is $1 \times 10^{14}/cm^3$ to $1 \times 10^{20}/cm^3$.

6. The method for producing a $Ga_2O_3$ based crystal film according to claim 1, wherein the Sn oxide comprises $SnO_2$, and
   wherein the Sn vapor is generated at a temperature of the cell of 450° C. to 1080° C.

7. The method for producing a $Ga_2O_3$ based crystal film according to claim 6, wherein the $Ga_2O_3$ based single crystal film is epitaxially grown at a growth rate of 0.01 μm/h to 100 μm/h.

8. The method for producing a $Ga_2O_3$ based crystal film according to claim 6, wherein the $Ga_2O_3$ based single crystal film is epitaxially grown at a growth temperature of 530° C. to 600° C.

9. The method for producing a $Ga_2O_3$ based crystal film according to claim 2, wherein the $Ga_2O_3$ based single crystal film is epitaxially grown at a growth rate of 0.01 μm/h to 100 μm/h.

10. The method for producing a $Ga_2O_3$ based crystal film according to claim 2, wherein a carrier concentration of the $Ga_2O_3$ based single crystal film is $1 \times 10^{14}/cm^3$ to $1 \times 10^{20}/cm^3$.

11. A method for producing a $Ga_2O_3$ based crystal film using a molecular beam epitaxy (MBE) method to form a conductive $Ga_2O_3$ based crystal film by epitaxial growth, the method comprising:

generating Ga vapor and Sn vapor and supplying the Ga vapor and the Sn vapor as a molecular beam to a surface of a $Ga_2O_3$ based crystal substrate, while an oxygen-based gas being supplied to a vacuum chamber, so as to grow a $Ga_2O_3$ based single crystal film comprising Sn, wherein the Sn vapor is generated by heating a Sn oxide that is filled in a cell of an MBE apparatus, wherein a growth temperature is set between 530° C. and 570° C., and wherein an n-type conductivity of the $Ga_2O_3$ based single crystal film is controlled by a temperature of the cell.

12. The method for producing a $Ga_2O_3$ based crystal film according to claim 1, wherein the Sn oxide comprises $SnO_2$, and wherein the $Ga_2O_3$ based single crystal film is epitaxially grown at a growth rate of 0.01 µm/h to 100 µm/h.

13. The method for producing a $Ga_2O_3$ based crystal film according to claim 1, wherein the Sn oxide comprises $SnO_2$, and wherein a carrier concentration of the $Ga_2O_3$ based single crystal film is $1\times10^{14}/cm^3$ to $1\times10^{20}/cm^3$.

14. The method for producing a $Ga_2O_3$ based crystal film according to claim 1, wherein the plane rotated by not less than 50° and not more than 90° with respect to the (100) plane includes one of a (010) plane, a (001) plane, a (−201) plane, a (101) plane, and a (310) plane.

15. The method for producing a $Ga_2O_3$ based crystal film according to claim 1, wherein an n-type conductivity of the $Ga_2O_3$ based single crystal film is controlled by a temperature of the cell.

16. The method for producing a $Ga_2O_3$ based crystal film according to claim 1, wherein a conductivity of the $Ga_2O_3$ based single crystal film is controlled by a temperature of the cell.

17. The method for producing a $Ga_2O_3$ based crystal film according to claim 11, wherein the Sn oxide comprises $SnO_2$, and wherein the $Ga_2O_3$ based single crystal film is epitaxially grown at a growth rate of 0.01 µm/h to 100 µm/h.

18. The method for producing a $Ga_2O_3$ based crystal film according to claim 17, wherein the Sn vapor is generated at a temperature of the cell of 450° C. to 1,080° C.

19. The method for producing a $Ga_2O_3$ based crystal film according to claim 11, wherein the Sn oxide comprises $SnO_2$, and wherein a carrier concentration of the $Ga_2O_3$ based single crystal film is $1\times10^{14}/cm^3$ to $1\times10^{20}/cm^3$.

20. The method for producing a $Ga_2O_3$ based crystal film according to claim 19, wherein the Sn vapor is generated at a temperature of the cell of 450° C. to 1,080° C.

* * * * *